(12) United States Patent
Ogata et al.

(10) Patent No.: US 7,326,512 B2
(45) Date of Patent: Feb. 5, 2008

(54) POLYMER COMPOUND, RESIST COMPOSITION AND DISSOLUTION INHIBITOR AGENT CONTAINING THE POLYMER COMPOUND

(75) Inventors: Toshiyuki Ogata, Kanagawa (JP); Kotaro Endo, Kanagawa (JP); Hiromitsu Tsuji, Kanagawa (JP); Masaaki Yoshida, Kanagawa (JP); Hideo Hada, Kanagawa (JP); Ryoichi Takasu, Kanagawa (JP); Mitsuru Sato, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 205 days.

(21) Appl. No.: 10/501,459

(22) PCT Filed: Nov. 28, 2003

(86) PCT No.: PCT/JP03/15247

§ 371 (c)(1),
(2), (4) Date: Jul. 14, 2004

(87) PCT Pub. No.: WO2004/050725

PCT Pub. Date: Jun. 17, 2004

(65) Prior Publication Data

US 2005/0130056 A1 Jun. 16, 2005

(30) Foreign Application Priority Data

Nov. 29, 2002 (JP) .............................. 2002-349167

(51) Int. Cl.
*G03F 7/039* (2006.01)
*C08F 18/20* (2006.01)
*C08F 214/18* (2006.01)
*C08F 14/18* (2006.01)

(52) U.S. Cl. .................... 430/270.1; 430/907; 526/245; 526/246; 526/250

(58) Field of Classification Search ................ 526/281, 526/319, 245, 246, 250; 430/270.1, 907
See application file for complete search history.

(56) References Cited

U.S. PATENT DOCUMENTS 3,776,729 A * 12/1973 Levy et al. ............... 430/280.1
5,397,669 A * 3/1995 Rao ........................... 430/114
6,018,008 A * 1/2000 Stacey et al. ............... 526/245
6,670,094 B2 12/2003 Nishi et al.
7,138,217 B2 * 11/2006 Aoai et al. ............... 430/270.1
2002/0068242 A1 * 6/2002 Matsuzawa .................. 430/311
2002/0081524 A1 6/2002 Uetani et al.
2002/0146639 A1 10/2002 Brock et al.
2003/0008231 A1 1/2003 Harada et al.
2003/0219678 A1 11/2003 Harada et al.

FOREIGN PATENT DOCUMENTS

| EP | 1460057 | * | 9/2004 |
|---|---|---|---|
| JP | 2001-174993 | | 6/2001 |
| JP | 2001-328964 | | 11/2001 |
| JP | 2002-196495 | | 7/2002 |
| JP | 2002-278069 | | 9/2002 |
| JP | 2002-293840 | | 10/2002 |
| JP | 2002-327013 | | 11/2002 |
| JP | 2002-363222 | | 12/2002 |
| JP | 2004-2725 | | 1/2004 |
| TW | 00527523 | | 4/2003 |
| WO | 03/055841 | | 7/2003 |
| WO | WO03/055841 | * | 7/2003 |
| WO | WO03/055841 | * | 10/2003 |

OTHER PUBLICATIONS

Crawford, M. et al., Advances in Resist Technology and Processing XVII Proceedings of SPIE, vol. 3999, p. 357-364 (2000).

* cited by examiner

Primary Examiner—Richard L. Schilling
(74) Attorney, Agent, or Firm—Wenderoth, Lind & Ponack, L.L.P.Z.

(57) ABSTRACT

Provided are a polymer compound having high transparency for use in a photoresist composition for microfabrication of the next generation, a resist composition using the polymer compound as a base polymer, and a dissolution inhibitor agent composed of the polymer compound.

To ensure etching resistance, an alicyclic group is introduced into a side chain portion. Hydrogen atoms on the ring of the alicyclic group are highly fluorinated to ensure transparency to light of 157 nanometer wavelength, represented by an adsorption coefficient equal to or less than $3.0\ \mu m^{-1}$. As the alicyclic group, a polycyclic group is preferably used. Hydrogen atoms are highly fluorinated by preferably substituting all hydrogen atoms on the ring by fluorine atoms, that is, forming a perfluoroalicyclic group. The resist composition is formed by using the polymer compound as a base polymer and further, the dissolution inhibitor agent is formed of the polymer compound.

23 Claims, No Drawings

POLYMER COMPOUND, RESIST COMPOSITION AND DISSOLUTION INHIBITOR AGENT CONTAINING THE POLYMER COMPOUND

TECHNICAL FIELD

The present invention relates to a polymer compound excellent in transparency suitable as a resin compound, which becomes soluble or insoluble in alkali in response to acid, used, for example, as the base polymer of a chemical amplification type resist composition for use in lithographic patterning of a semiconductor integration circuit, and a dissolution inhibitor agent optionally added to the resist composition, and also relates to a resist composition and a dissolution inhibitor agent using the polymer compound as a resin component.

BACKGROUND ART

It is no exaggeration to say that miniaturization of a semiconductor integrated circuit pattern has been attained by the progress of photolithography and peripheral technologies. The photolithography, as known well, is supported by roughly two techniques: one is a technique regarding the wavelength of the applied light and the number of openings of a reduced projection light exposure apparatus called a stepper, and the other is a technique regarding resist properties, mainly the resolution of a photoresist composition onto which a mask pattern is to be transferred by the stepper. These two techniques have worked with each other, like two wheels of a car, to improve the accuracy of photolithographic pattern-processing of a semiconductor integrated circuit.

The wavelength of a light source-used in a stepper has been made shorter and shorter in order to satisfy the requirement for higher resolution of a circuit pattern. To obtain a resist resolution of about 0.5 micrometers, generally use is made of a "g" line of a mercury lamp having a main spectrum at 436 nanometers and to obtain a resist resolution of about 0.5 to 0.30 micrometers, use is made of an "i" line of a mercury lamp having a main spectrum at 365 nanometers. Furthermore, to obtain a resist resolution of about 0.30 to 0.15 micrometers, KrF excimer laser of 248 nanometers is used. To obtain a resist resolution of about 0.15 micrometers or less, ArF excimer laser light of 193 nanometers is used. For further reduction, use of $F_2$ excimer laser light of 157 nanometers and $Ar_2$ excimer laser light of 126 nanometers, has been studied.

On the other hand, in view of a photoresist composition, various attempts have been made including the combination of a photoresist composition with an organic or inorganic reflection protecting film, and contrivance of illumination systems. By virtue of these attempts, lithography using KrF excimer laser light has been still in use and therefore a KrF photoresist prolongs its life at the present time. More specifically, a KrF photoresist composition has been developed with a wavelength of λ/2 or less, about 110 nanometers, in view. Also in the lithography using ArF excimer laser light, it has been desired to develop an ArF photoresist composition suitable for a large-scale production of a future design for about not more than 90 nanometer node. Furthermore, the lithography using $F_2$ excimer laser light has received attention because it can realize future microfabrication of about 65 nanometers or less. Therefore, the development of a photoresist composition has been proceeding for sufficiently attaining the lithographic microfabrication using F2 excimer laser light.

As is well known, in the lithography, short-wavelength light is applied to a photoresist layer coated on a laminated semiconductor substrate via a mask having a negative pattern or a positive pattern of a desired semiconductor integrated circuit (light exposure). The photoresist layer contains a photosensitive polymer as a main component, which reacts with irradiated light to become insoluble (negative) or soluble (positive) in alkali. After pattern light exposure, the resist layer is subjected to a post exposure baking step to secure the reaction of the resist layer caused by light exposure. Subsequently, the resist layer is developed to remove a soluble portion. As a result, a photoresist pattern layer which accurately reflects the desired circuit pattern is formed on the laminated semiconductor substrate. Thereafter, in some cases, the patterned photoresist layer is subjected to a post baking step to sufficiently cure it in order to give resistance to the following etching step. In the etching step, using the patterned photoresist layer as a mask, the surface layer or the upper layer of the laminated semiconductor substrate is dry-etched along the pattern.

Therefore, the most important property required for a photoresist composition is to provide good resolution. To attain this, patterning light (applied light) must reach not only the surface portion of a resist layer but also the bottom portion near the substrate, thereby allowing light to sufficiently reach the bottom portion of the irradiated resist layer. In other words, the resist layer must have "transparency to irradiation light".

As is well known, to satisfy the requirements for the lithographic microfabrication as mentioned above, chemical amplification-type resist compositions have been used primarily in recent years. The chemical amplification-type resist composition contains at least a polymer compound having a group highly reactive to acid, an acid generating agent generating acid upon light exposure, and a solvent dissolving them. When the coating film of the resist composition is exposed to patterning light, acid is released from the acid generating agent present in the exposed portion and reacts with the base polymer (polymer compound mentioned above) present in the light exposure portion. In a positive resist composition, the base polymer becomes soluble in alkali since a protecting group (also called as acid-dissociable dissolution suppressing group) is removed from the base polymer by the catalytic action of the acid. Therefore, when the resist layer having a latent image is partially developed by using an alkaline developing solution, a positive-type resist pattern to the mask pattern can be obtained. On the other hand, in a negative resist composition which uses a polymer soluble in a developing solution, the light exposure portion becomes insoluble in the developing solution by the catalytic action of the acid. To the chemical amplification type resist composition, another polymer component serving as a dissolution inhibitor agent may be optionally added. The dissolution inhibitor agent is a polymer having a relatively lower molecular weight of 5,000 or 3,000 or less. The dissolution inhibitor agent, from which a protecting group is removed by an acid generated from an acid generating agent, increasing its solubility in an alkaline developing solution. In other words, the dissolution inhibitor agent suppresses the portion of the resist film remaining as an insoluble portion (non light-exposure portion) from being dissolved in the alkaline developing solution and simultaneously accelerates dissolution of a soluble portion (light exposure portion) by the alkaline developing solution.

To improve the transparency of a chemical amplification type resist composition to light applied thereto, a base polymer and an optionally added polymer serving as a dissolution inhibitor agent must be composed of a polymer compound exhibiting high transparency of the applied light.

The resin components such as the base polymer and dissolution inhibitor agent of a resist composition to be used in the lithography by $F_2$ excimer laser light, which is a light source of the next generation stepper, must have high transparency to the main spectrum (157 nanometers) of the $F_2$ excimer laser light. A desired transparency of the resist film to light having a wavelength of 157 nanometers is disclosed for example in M. K. Crawford et al., "New material for 157 nanometers Photoresists: Characterization and Properties", Proceedings of SPIE, Vol. 3999 (2000), pp357 to 364. This document reveals that the absorption coefficient (optical coefficient) of a resist film (normalized in thickness) must be equal to or less than 3.0 ($\mu m^{-1}$) to obtain a sufficient pattern transfer resolution.

In contrast, a conventional resist material absorbs light having a wavelength of 157 nanometers. In other words, the transparency of the conventional resist material to the applied light having a wavelength of 157 nanometers is low. This means that it is impossible to obtain the next generation resist composition based on the conventional resist materials.

As described above, in the technical field of providing photoresist compositions, it has been investigated to develop a polymer compound having high transparency to light having a wavelength of 157 nanometers. Up to the present, fluorine (F) and silicon (Si) are introduced to a polymer compound to attain the transparency to applied light having the main spectrum at a wavelength of 157 nanometers. Based on this, a novel polymer having not only the transparency but also good resist performances, such as alkaline solubility determining the developing characteristics after light exposure, pattern transfer resolution, and etching resistance, has been developed. However, as to how many percentages of fluorine and silicon-should be introduced, which part of a polymer molecule they should be introduced, and which components of the polymer they should be introduced have not yet been clarified in order to improve the transparency to applied light to a desired level or more while maintaining other characteristics such as dry-etching resistance.

As base polymers for resist compositions having transparency to an ArF excimer laser light, the following polymers are conventionally known: a copolymer of an acrylic ester monomer having an alicyclic group structure and a δ-lactone structure linked to and an androsteron derivative, for example, disclosed in Japanese Patent Application Laid-Open No. 2001-174993; a polymer of a polycyclic unsaturated hydrocarbon derivative which is obtained by subjecting an acrylic acid having an electron-withdrawing substituent at the a position and cyclopentadien or dicyclopentadien to the Diels-Alder reaction to obtain a polycyclic unsaturated carboxylic acid, followed by substituting a hydrogen atom of a hydroxyl group of the unsaturated carboxylic acid by an acid dissociable dissolution suppressing group, for example, disclosed in Japanese Patent Application Laid-Open No. 2001-328964; a copolymer having a monomeric unit derived from an alicyclic hydrocarbon having a polymeric carbon-carbon double bond in the alicyclic ring and a monomeric unit derived from (meta) acrylonitirile, for example, disclosed in Japanese Patent Application Laid-Open No. 2002-196495; a polymer having a monomer having a lactone structure combined to a vinyl group as a monomeric unit, for example, disclosed in Japanese Patent Application Laid-Open No. 2002-278069; and a copolymer of acrylic ester monomer having a fluorine atom at the a position and a vinyl ether derivative, for example, disclosed in Japanese Patent Application Laid-Open No. 2002-293840. In the copolymer disclosed in Japanese Patent Application Laid-Open No. 2001-174993, a fluorine atom is not introduced to improve the transparency. In the polymer disclosed in Japanese Patent Application Laid-Open No. 2001-328964, fluorine is introduced partly in a monomeric unit or in a side chain ring; however, the relationship between the fluorine introduction and the transparency is not clear. In the copolymer disclosed in Japanese Patent Application Laid-Open No. 2002-196495, fluorine is introduced in a part of a terminal-end protecting group of a side chain ring; however, the relationship between the fluorine introduction and the transparency is not clear. In the polymer disclosed in Japanese Patent Application Laid-Open No. 2002-278069, fluorine is not introduced to improve the transparency. In the copolymer disclosed in Japanese Patent Application Laid-Open No. 2002-293840, a copolymer in which part or the about half of hydrogen atoms on a side chain ring are substituted by fluorine atoms is exemplified; however, the relationship between the substitution and the transparency is not clear.

As described above, various polymer compounds have been proposed up to present to improve the transparency to the applied light having a wavelength of 200 nanometers or less. However, it has not yet been elucidated as to which formula of a polymer fluorine should be introduced, which part of the polymer molecule fluorine should be introduced, and how many percentages of fluorine should be introduced have not yet been clarified in order to improve the transparency to light to a desired level or more while maintaining other characteristics such as dry-etching resistance.

DISCLOSURE OF THE INVENTION

The present invention has been achieved in order to solve the above problems. It is an object of the invention is to provide a polymer compound having high transparency for use in a photoresist composition for the microfabrication of the next generation, and a resist composition and a dissolution inhibitor agent having the polymer compound, and more specifically, to provide a polymer compound having the transparency represented by an absorption coefficient equal to or less than 3.0 $\mu m^{-1}$ to the applied light having a wavelength of 157 nanometers, a resist compound containing the polymer compound as a base polymer and a dissolution inhibitor agent consisted by the polymer compound.

The present inventors conducted intensive studies to overcome the aforementioned problems. As a result, they found that the transparency represented by an absorption coefficient equal to or less than 3.0 $\mu m^{-1}$ to the applied light having a wavelength of 157 nanometers can be obtained by introducing an alicyclic group into a side chain portion of the polymer, thereby ensuring etching resistance, and simultaneously substituting more than half number of hydrogen atoms on the ring of the alicyclic group by fluorine atoms. Furthermore, they found that a polycyclic group is preferably used as the alicyclic group and that high-level fluorine substation is desirably attained by substituting all hydrogen atoms on the ring by fluorine atoms, in other words, by forming a perfluoroalicyclic group.

It is an object of the present invention is to provide a polymer compound. The polymer compound according to the present invention is one having a monomeric unit which has an alicyclic group in a side chain and characterized in that the alicyclic group is highly fluorinated and has transparency represented by an absorption coefficient equal to or less than 3.0 $\mu m^{-1}$ to light having a wavelength of 157 nanometers.

It is another object of the present invention is to provide a resist composition. The resist composition of the present invention includes the polymer compound mentioned above. The resist composition may contain the polymer compound as a base polymer or as a dissolution inhibitor agent optionally added, or may contain both. However, when it is used as the base is polymer of a resist composition, the polymer compound has a weight-average molecular weight of 1,000 to 20,000, preferably 3,000 to 20,000. When used as a dissolution inhibitor agent, the polymer compound preferably has a weight-average molecular weight of 1,000 to 5,000.

As described above, the polymer compound according to the present invention is one having a monomeric unit which has an alicyclic group in a side chain and characterized in that the alicyclic group is highly fluorinated and has transparency represented by an absorption coefficient equal to or less than 3.0 μm$^{-1}$ to light having a wavelength of 157 nanometers. Such a polymer compound can be expressed by general formula (1):

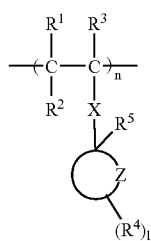

where n is an integer; X is an ester group of carboxylic acid,

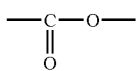

ether group (—O—), —CH$_2$—O—, or an alkylidene group,

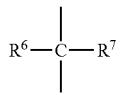

Z enclosed by a circle is a highly fluorinated alicyclic group, preferably, a polycyclic group; R$^1$, R$^2$, R$^3$, R$^5$, R$^6$ and R$^7$ are independently one selected from the group consisting of a hydrogen atom, lower alkyl group, fluorine atom, and fluorinated lower alkyl group; I is an integer of 0 to 3; and R$^4$ is a hydroxyl group.

In the general formula (1), the alicyclic group represented by circled Z is preferably an adamantyl group as a tricyclic alicyclic hydrocarbon group. It is desirable that the hydrogen atoms on the ring of alicyclic group are mostly fluorinated, and more desirable that the alicyclic group is a perfluoroadamrantyl group.

BEST MODE FOR CARRYING OUT THE INVENTION

As described above, the polymer compound according to the present invention is one having a monomeric unit containing an alicyclic group in a side chain, in which the alicyclic group is highly fluorinated, and having transparency represented by an absorption coefficient equal to or less than 3.0 μm$^{-1}$ to the applied light having a wavelength of 157 nanometers.

In such a construction, the alicyclic group is desirable that all hydrogen atoms on the ring are fluorinated. However, when a hydrophilic substituent (e.g., hydroxyl group) other than a hydrogen atom is present on the ring, the substituent is not fluorinated. In addition, the alicyclic group is desirably a polycyclic group.

The alicyclic group may contain a hydrophilic group. Because of the presence of a hydrophilic group, it is expected that, when the polymer compound is used as the base polymer and a dissolution inhibitor agent of a resist composition, the adhesion property of a resist film and a resist pattern to a substrate can be improved.

As the alicyclic group, an alicyclic group of an ArF resist may be used. In particular, as a polycyclic group, any one of known polycyclic groups may be used. Examples of the alicyclic groups include groups obtained by removing a single hydrogen atom from bicycloalkane, tricycloalkane, and tetracycloalkan, more specifically, groups obtained by removing a single hydrogen atom from polycycloalkanes such as adamantane, norbornane, isobornane, tricyclodecane, and tetracyclododecane. Among them, an adamantyl group, norbornyl group, and tetracyclododecanyl group are preferable in an industrial point of view. Particularly, an adamantyl group is preferable. An adamantyl group exhibits high transparency to not only light of not more than 300 nanometer wavelength but also light of not less than 300 nanometer wavelength and therefore more widely and preferably used in a resist composition.

As the monomeric unit, a unit derived by cleavage of an ethylenic double bond such as acrylic ester or metacrylic ester, vinyl ether, or allyl ether may be preferably used.

Furthermore, the polymer compound according to the present invention is preferably a copolymer; in other words, may have a second monomeric unit. If the second monomeric unit is contained, a substituent having a sensitivity to acid can be linked to the second monomeric unit. By virtue of this, alkaline solubility or alkaline insolubility can be controlled by an acid catalytic function of the polymer thus imparted to the second monomeric unit, thereby improving the degree of freedom in designing sensitivity to the acid catalyst. More specifically, the second monomeric unit may have an acid dissociating group and an insoluble group in acid.

Furthermore, as the second monomeric unit, a monomeric unit derived from acrylic ester or metacrylic ester and a monomeric unit derived by cleavage of an ethylenic double bond such as tetrafluoroethylene may preferably be used.

As an acrylic ester or metacrylic ester prefereably used as a monomeric unit, for example, compounds having the following structures may be mentioned.

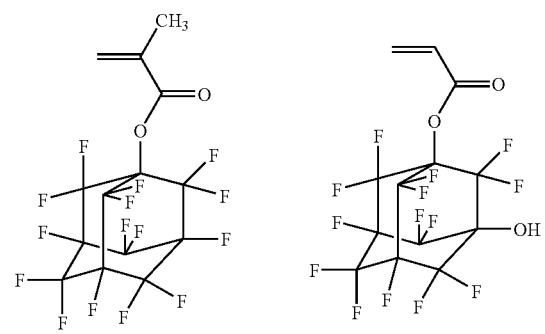

-continued

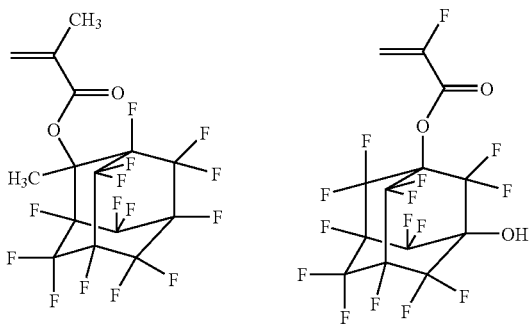

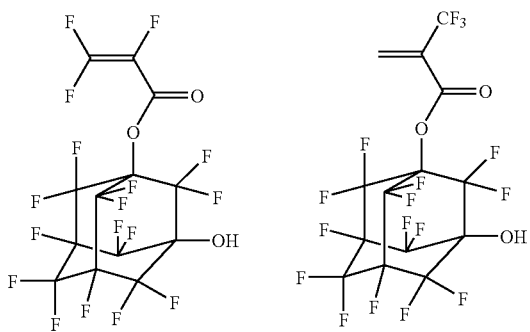

Furthermore, as vinyl ether preferably used as a monomeric unit, for example, a compound having the following structure may be mentioned.

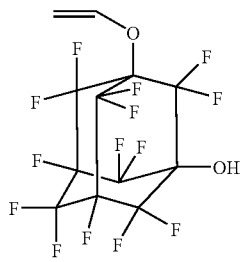

As an allyl ether preferably us ed an a monomeric unit, a group having the following structure may be used.

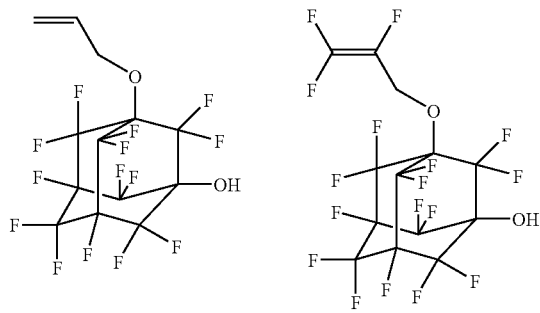

Specific examples of a polymer having a monomeric unit containing an adamantly group suitable as an alicyclic group include 1-perfluoroadamantyl methacrylate having a monomeric unit represented by general formula (2) and a polymer having a monomeric unit derived from 3-hydroxy-1-perfluoroadamantyl acrylate having a monomeric unit represented by general formula (3). Note that, m and n in the formula below are integers.

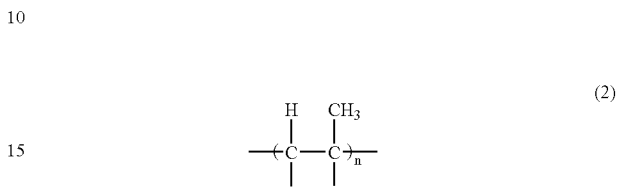

(2)

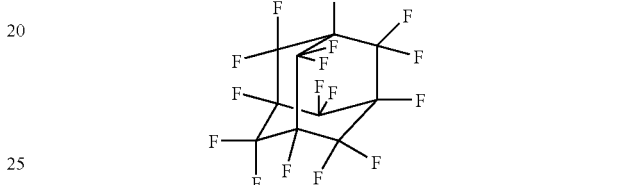

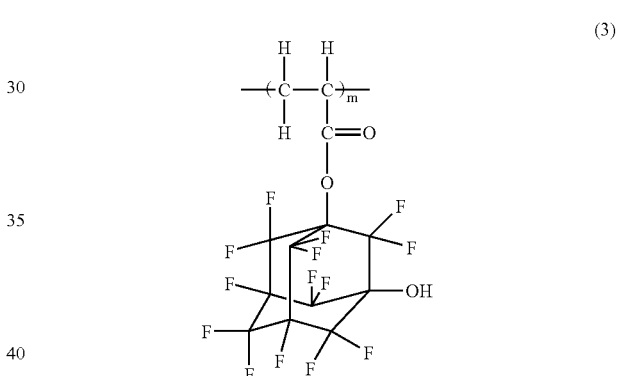

(3)

1-perfluoroadamantyl metacrylate and 3-hydroxy-1-perfluoroadamantyl acrylate may be obtained generally by the following synthetic method, as an example. After 1 equivalent of 1-hydroxylperfluoroadamantane or perfluoroadamantanediol and 1.2 equivalents of triethylamine are dissolved in diethyl ether, 1 equivalent of chloride acrylate or chloride metacrylate is added slowly and dropwise to the resultant solution under ice cooling. After completion of the reaction, water is added to the reaction solution and extracted with diethyl ether. The organic layer obtained is dried over magnesium sulfate. After magnesium sulfate is filtered off, the obtained diethyl ether solution was concentrated and subjected to column-chromatographic separation to obtain 1-perfluoroadamantyl (meta)acrylate or 3-hydroxy-1-perfluoroadamantyl (meta)acrylate. If these monomers are obtained, a polymer compound having each of the monomers as a unit can be obtained by a radical polymerization method or the like using a known polymerization initiation agent such as azobisisobutyronitrile (AIBN).

Furthermore, as an example of a compound having a monomeric unit derived from a preferable acrylic ester or a metacrylic ester as a second monomeric unit, groups having the following structures may be mentioned.

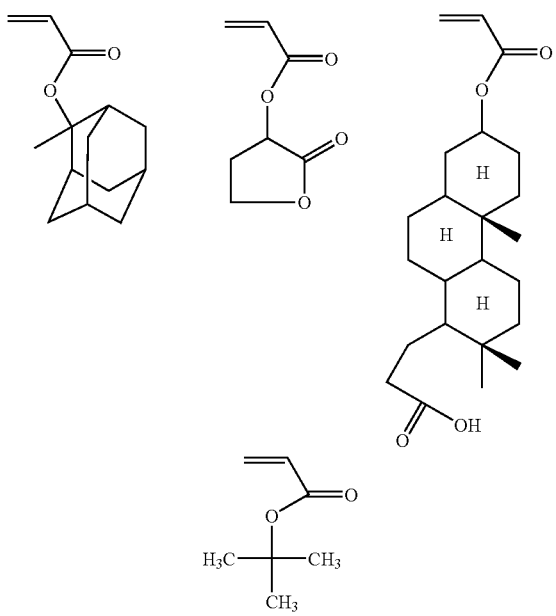

Furthermore, as a compound having a monomeric unit derived by cleavage of another vinylic double bond suitable as a second monomeric unit, those having the following structures may be mentioned.

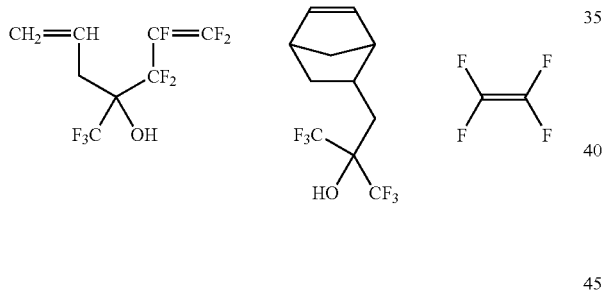

In addition to this, a fluorine-containing monocyclic monomeric unit disclosed in Japanese Patent Application Laid-Open No. 2002-90997 may be used. The fluorine-containing monocyclic polymer disclosed in Japanese Patent Application Laid-Open No. 2002-90997 is one including a repeat unit of a cyclic structure formed through a cyclization reaction between a monomer unit of a diene system monomer (a), which is composed of a compound lo represented by $CH_2=CH-Y-CH=CH_2$, or a derivative thereof, and a monomer unit of a fluorine-containing vinyl monomer (b); and a protected acidic group derived from, a fluorine-containing vinyl monomer. In the aforementioned formula, Y represents a methylene group or an oxygen atom. Examples of the derivative of (a) include compounds having an alkyl-group substituent and a hydroxide-group substituent, where the alkyl-group substituent is preferably a lower alkyl group having 1 to 4 carbon atoms. These second monomeric units must have an acid dissociable dissolution suppressing group when they are used as a positive resist, whereas they must have an insoluble group in acid when they are used as a negative resist. Furthermore, to enhance the adhesiveness between a substrate and a resist pattern, a monomeric unit having a γ-butyrolactone group may be used. To further improve transparency, a compound of the present invention such as tetrafluoroethylene may be used. If necessary, these compounds may be appropriately used in a combination of two or more elements to obtain a tertiary, quaternary, or quinary copolymer. Note that specific examples of the structure of a polymer compound according to the present invention are as follows:

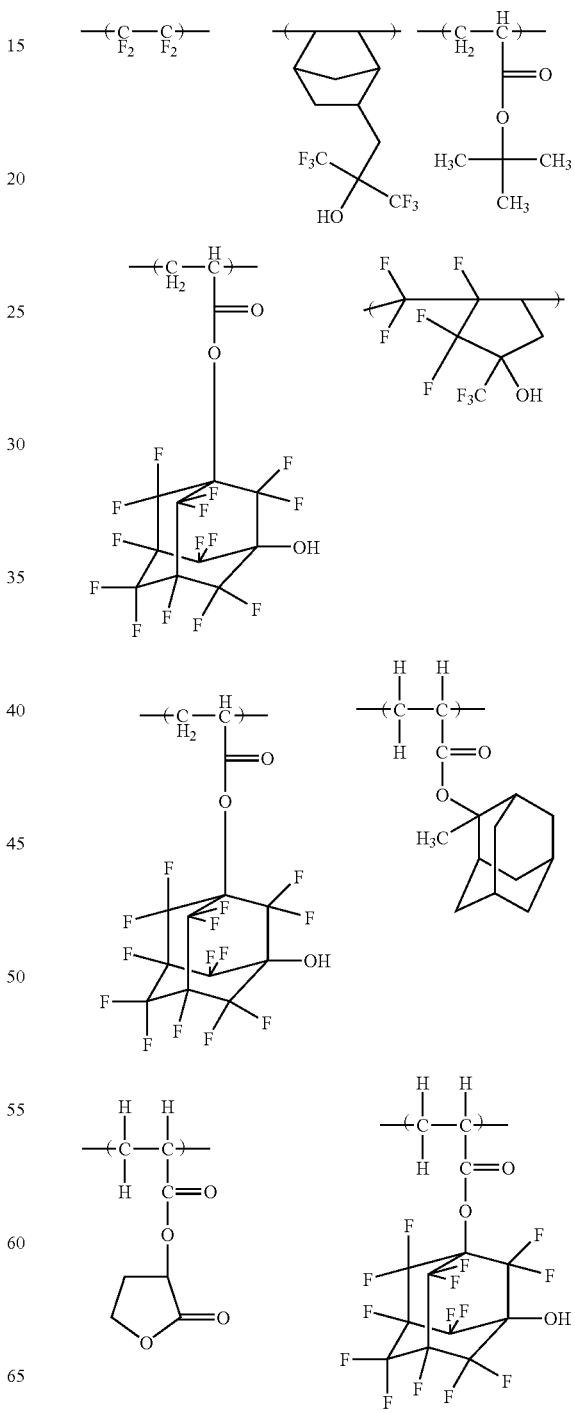

-continued

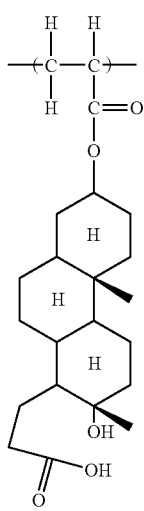
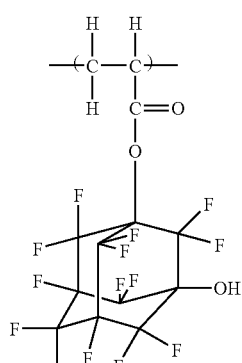

Furthermore, as the acid dissociable dissolution suppressing group, any group may be used as long as it has been proposed as an acid dissociable dissolution suppressing group in a chemical amplification type positive resist; however, particularly one formed of a tertiary alkyl group may be used. Specific examples of the tertiary alkyl group include those formed of a chain alkyl group, such as tert-butyl group and tert-amyl group or the like, and those formed of a cyclic alkyl group and a chain alkyl group, such as a 2-methyl-2-adamantyl group, and a 2-ethyl-2-adamantyl group or the like.

Furthermore, as the insoluble group in acid, a hydroxycarbonic acid such as δ-hydroxycarbonic acid disclosed in Japanese Patent Application Laid-Open No. 2001-174993, from which a lactone can be produced by the action of an acid, may be mentioned.

A polymer compound according to the present invention contains a monomeric unit having a highly fluorinated alicyclic group as described above, and more preferably, contains the monomeric unit and a second monomeric unit. The polymer compound may be used as not only the base polymer but also the dissolution inhibitor agent of a chemical amplification resist. When the polymer compound is used as the dissolution inhibitor agent, as is the case where the polymer compound is used as the base polymer for a positive resist, it must contain an acid dissociable dissolution suppressing group having a weight—average molecular weight of about 2,000 to 5,000. The dissolution inhibitor agent may be used in combination with a polymer compound according to the present invention or another known base polymer.

A polymer compound according to the present invention may be easily produced by a known polymerization method, typically by a radical polymerization. A polymer compound is produced by dissolving a requisite monomer in a solvent, for example, tetrahydrofuran, ethyl acetate, methylisobutylketone or methylethylketone or the like, and adding a radical polymerization initiating agent to the resultant solution, followed by heating.

Examples of the polymerization initiating agent include azobisisobutyronitrile (AIBN)(application temperature: 60 to 90° C.), 2,2'-azobis-(2,4-dimethyl valeronitrile (application temperature: 45 to 70° C.), 2,2'-azobis-(2-methylisobutyronitrile (application temperature: 60 to 95° C.), tert-butylperoctoate (application temperature: 75 to 100° C.), 1,1'-azobis-(cyclohexane-1-carbonitirile) (application temperature: 80 to 110° C.), and 1-[(1-diazo-1-methylethyl)azo] formamide (application temperature: 95 to 120° C.) or the like, and which may be used singly or in combination. In particular, AIBN is preferably used as a general polymerization initiation agent.

Thereafter, a reaction solution containing the polymer compound thus obtained is added dropwise to a large volume of poor solvent such as isopropanol, methanol, water, n-heptane, or n-hexane or the like to precipitate the polymer compound. Thereafter, the obtained precipitate is filtrated and dried to obtain the polymer compound according to the present invention (resin). This precipitation step, even though it is not required in some cases, is useful to remove a monomer and a polymerization initiation agent remaining unreacted in a reaction solution. If an unreacted monomers and polymerization initiation agent remain as they are, they may negatively affect the performance of a resist, so that it is preferable to remove them. Furthermore, to prepare a resist composition, a component serving as an acid generating agent must be blended together in the composition.

As an acid generating agent to be used in the resist composition according to the present invention, any agent may be used as long as it is appropriately selected from known acid generating agents for use in chemical amplification type resists.

Examples of the acid generating agent include onium salts such as diphenyl iodonium trifluoromethanesulfonate, (4-methoxyphenyl)phenyl iodonium trifluoromethanesulfonate, bis(p-tert-butylphenyl) iodonium trifluoromethanesulfonate, triphenyl sulfonium trifluoromethanesulfonate, (4-methoxyphenyl)diphenyl sulfonium trifluoromethanesulfonate, (4-methylphenyl)diphenyl sulfonium nonafluorobutanesulfonate, (p-tert-butylphenyl)diphenyl sulfonium trifluoromethanesulfonate, diphenyl iodonium nonafluorobutanesulfonate, bis(p-tert-butylphenyl) iodonium nonafluorobutanesulfonate, and triphenylsulfonium nonafluorobutanesulfonate or the like. Among them, an onium salt containing fluoroalkylsulfonate ion as an anion is preferable.

As the acid generating component, a single acid generating agent may be used alone or two or more acid generation agents may be used in combination.

The amount of an acid generating agent to be used is 0.5 to 30 parts by weight, preferably 1 to 10 parts by weight based on the amount of the base polymer as 100 parts. If the amount is less than 0.5 parts by weight, pattern formation is not performed sufficiently. On the other hand, if the amount exceeds 30 parts by weight, a homogeneous solution is hardly obtained, with the result that storage stability may decrease.

A resist component according to the present invention can be produced by dissolving the base polymer and the acid generating agent, and optionally, the dissolution suppressing agent and an arbitrary component (described later) in an organic solvent.

As the organic solvent, any organic solvent may be used as long as it can dissolve each of the components mentioned above to make a homogeneous solution and may be appropriately selected from known solvents for use in chemical amplification resists and used singly or in admixture with two or more solvents.

Examples of the organic solvent include ketones such as acetone, methylethyl ketone, cyclohexanone, methylisoamyl ketone, and 2-heptanone or the like; polyalcohols and derivatives thereof such as a monomethyl ether, monoethyl ether, monopropyl ether, monobutyl ether or monophenyl ether or the like of ethylene glycol, ethylene glycol monoacetate, diethylene glycol, diethylene glycol monoacetate, propylene glycol, propylene glycol monoacetate, dipropylene glycol, and dipropylene glycol monoacetate or the like;

cyclic ethers such as dioxane; and esters such as methyl lactate, ethyl is lactate, methyl acetate, ethyl acetate, butyl acetate, methyl pyruvate, ethyl pyruvate, methyl methoxypropionate, and ethyl ethoxypropionate or the like. These organic solvents may be used singly or in admixture with two or more members.

Among them, propylene glycol monomethyl ether acetate (PGMEA) and propylene glycol monomethyl ether (PGME) may be preferably used. Furthermore, it is preferable that these solvents are mixed with polar solvents having a hydroxyl group and lactone such as ethyl lactate (EL) and γ-butyro lactone or the like. This is because the storage stability of a resist composition can be improved.

A resist composition according to the present invention may contain a known amine component, preferably, a secondary lower aliphatic amine or a tertiary lower aliphatic amine, as an optional component, in order to stabilize a resist pattern and stabilize storage with time.

The term "lower aliphatic amine" refers to an amine of an alkyl and alkylalcohol having equal to or less than 5 carbon atoms. Examples of the secondary and tertiary amines include trimethylamine, diethylamine, triethylamine, di-n-propylamine, tri-n-propylamine, tripentylamine, diethanolamine, and triethanolamine or the like. Among them, particularly, alkanolamine such as triethanolamine is preferable.

These amines may be used singly or in admixture with two or more members. These amines may be used in an amount of 0.01 to 1 part by weight based on the amount of the base polymer component.

To the resist composition according to the present invention, a miscible additive may be further added if desired. Examples of such a miscible additive include an additional resin for improving the performance of a resist film, a surfactant for improving coating ability, dissolution suppressing agent, plasticizer, stabilizer, coloring agent, and halation preventing agent or the like.

(Pattern formation method)

A method of forming a resist pattern will be described next.

First, a resist composition according to the present invention is applied onto a substrate such as a silicon wafer or the like by a spinner or the like and subjected to prebaking. Subsequently, the coating film of the resist composition is selectively exposed to light through a desired mask pattern by means of light exposure apparatus, and thereafter, subjected to post-exposure baking (PEB). Subsequently, the coating film is developed with an alkaline developing solution and rinsed with pure water. By a series of treatments, the coating film of the resist composition is patterned in accordance with the mask pattern to obtain a resist pattern.

The wavelength of light to be applied is not particularly limited. ArF excimer laser, KrF excimer laser, $F_2$ excimer laser, extreme ultra violet (EUV) light, vacuum ultra violet (VUV) light, electron beam, and radioactive rays such as X-rays and soft X-rays or the like may be used. In particular, the resist composition according to the present invention effectively works in response to $F_2$ excimer laser.

Note that an anti-reflection film formed of an organic or inorganic material may be formed between the substrate and the coating film of a resist composition.

The polymer compound according to the present invention may be a monopolymer having a highly fluorinated monomeric unit having an alicyclic group at a side chain or a copolymer with a second monomeric unit. In the case of a copolymer, the amount of a first monomeric unit may fall within the range of 5 to 40% by mole, preferably 10 to 35% by mole, whereas the amount of a second monomeric polymer may fall within the range of 60 to 95% by mole, preferably 65 to 90% by mole. The second monomeric unit may be used in admixture of two or more members.

EXAMPLES

The present invention will be explained by way of examples, which are used for more preferably illustrating the present invention, but not intended to limit the present invention.

Resin Synthesis Example 1

First, 5.0 grams of 1-perfluoroadamantyl methacrylate was dissolved in 20 milliliters of tetrahydrofuran and further 0.1 gram of azobisisobutyronitrile was added. After heating at 70° C. for 5 hours under reflux, the resultant solution was added dropwise to 500 milliliters of methanol. The precipitated resin was filtered off, and dried under reduced pressure to obtain a white powdery resin. The resin was a polymer compound having a monomeric unit represented by the general formula (2) mentioned above. The yield of the resin was 1 gram. The weight-average molecular weight (Mw) of the resin was 8,000 and the degree of dispersion (Mw/Mn) was 1.6. Hereinafter, the resin will be referred to as Resin 1.

Resin Synthesis Example 2

First, 10.0 grams of 3-hydroxy-1-perfluoroadamantyl acrylate was dissolved in 50 milliliters of tetrahydrofuran and further 0.1 gram of azobisisobutyronitrile was added. After heating at 70° C. for 5 hours under reflux, the resultant solution was added dropwise to 1 liter of n-heptane. The precipitated resin was filtered off, and dried under reduced pressure to obtain a resin. The resin was a polymer compound having a monomeric unit represented by the general formula (3) mentioned above. The yield of the resin was 5.1 grams. The weight-average molecular weight (Mw) of the resin was 4,800 and the degree of dispersion (Mw/Mn) was 1.28. Hereinafter, the resin will be referred to as Resin 2.

Resin Synthesis Example 3

First, 4.40 grams of 2-methyl-2-adamantyl acrylate, 3.12 grams of γ-butyrolactone acrylate, and 4.74 grams of 3-hydroxyperfluoroadamantyl acrylate were dissolved in 50 milliliters of tetrahydrofuran, and further 0.61 grams of azobisisobutyronitrile was added. After heating at 70° C. for 5 hours under reflux, the resultant solution was added dropwise to 1 liter of n-heptane. The precipitated resin was filtered off, and dried under reduced pressure to obtain a resin. The resin was a polymer compound having three types of monomeric units represented respectively by general formulas (4), (5) below and the general formula (3) mentioned above. The yield of the resin was 7.0 grams. The weight-average molecular weight (Mw) of the resin was 5,100 and the degree of dispersion (Mw/Mn) was 2.37. Hereinafter, the resin will be referred to as Resin 3. Note that, in general formulas (4) and (5) below, p and q are integers. The obtained polymer compound is useful as the base polymer of a positive type resist and a dissolution inhibitor agent.

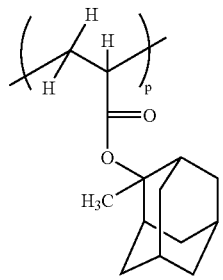

(4)

-continued (5)

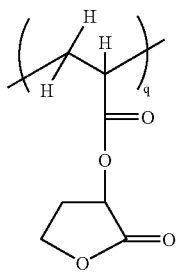

Resin Synthesis Example 4

First, 2.8 grams of a lactone monomer and 2.4 grams of 3-hydroxy perfluoroadamantyl acrylate were dissolved in 90 milliliters of tetrahydrofuran, and further 0.15 grams of azobisisobutyronitrile was added. After heating at 70° C. for 5 hours under reflux, the resultant solution was added dropwise to 1 liter of n-heptane. The resultant solid matter was filtrated, and dried at 40° C. for 3 hours under vacuum. 3.0 g of the obtained resin was dissolved in 100 milliliters of tetrahydrofuran and 110 grams of tetramethyl ammonium hydroxide (TMAH) was added. After the solution mixture was stirred at room temperature for 6 hours, the mixture was neutralized with 0.04N of HCl. The hydrolyzed resin was extracted with ethyl acetate. The organic layer was washed with pure water and added dropwise to 1 liter of n-heptane. The precipitated resin was filtrated off and dried at 30° C. for 2 hours under vacuum to obtain a resin. The resin was a polymer compound having two types of monomeric units represented respectively by general formula (6) below and the general formula (3) mentioned above. The yield of the resin was 1.5 grams. The weight-average molecular weight (Mw) of the resin was 1,200 and the degree of dispersion (Mw/Mn) was 1.79. Hereinafter, the resin will be referred to as Resin 4. Note that, in general formula (6) below, r is an integer. The obtained polymer compound is useful as the base polymer of a negative type resist.

(6)

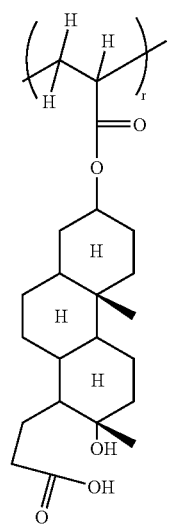

Comparative Resin Synthesis Example 1

First, 10.0 grams of 1-adamantyl methacrylate was dissolved in 50 milliliters of tetrahydrofuran and 0.5 grams of azobisisobutyronitrile was added. After heating at 70° C. for 5 hours under reflux, the resultant solution was added dropwise to 1 liter of methanol. The precipitated resin was filtered off, and dried under reduced pressure to obtain a resin. The resin was a polymer compound having a monomeric unit represented by general formula (7) below. The yield of the resin was 8.0 grams. The weight-average molecular weight (Mw) of the resin was 6,000 and the degree of dispersion (Mw/Mn) was 1.5. Hereinafter, the resin will be referred to as Comparative Resin 1.

(7)

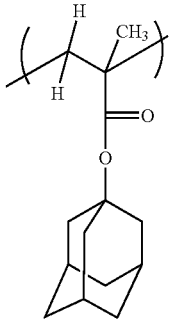

Comparative Resin Synthesis Example 2

First, 10.0 grams of 3-hydroxy-1-adamantyl acrylate was dissolved in 50 milliliters of tetrahydrofuran and further 0.5 grams of azobisisobutyronitrile was added. After heating at 70° C. for 5 hours under reflux, the resultant solution was added dropwise to 1 liter of methanol. The precipitated resin was filtered off, and dried under reduced pressure to obtain a white powdery resin. The resin was a polymer compound having a monomeric unit represented by general formula (8) below. The yield of the resin was 8.0 grams. The weight-average molecular weight (Mw) of the resin was 6,100 and the degree of dispersion (Mw/Mn) was 2.8. Hereinafter, the resin will be referred to as Comparative Resin 2.

(8)

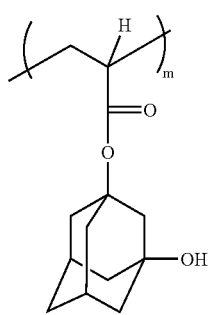

Example 1

Measurement of Transparency (Absorption Coefficient) of Resin

Resin 1 and Comparative resin 1 were separately dissolved in toluene. Resin 2 and Comparative resin 2 were separately dissolved in propylene glycol monomethyl ether (PGME). These four resin solutions were applied onto magnesium fluoride wafers respectively with a final film thickness (after dry) of 0.1 micrometer. The coating films were prebaked on a direct hot plate at 130° C. for 60 seconds respectively to form four types of resin films. Each of the resin films thus prepared was measured for transparency (absorption coefficient) to light having wavelengths of 157 nanometers and 193 nanometers by vacuum ultraviolet spectrophotometer (manufactured by JASCO Corporation). The results are shown in table 1.

TABLE 1

| | Absorption coefficient (abs/μm) | |
|---|---|---|
| | 157 nm wavelength | 193 nm wavelength |
| Resin 1 | 2.42 | 0.20 |
| Resin 2 | 2.66 | 0.21 |
| Comparative resin 1 | 6.52 | 0.32 |
| Comparative resin 2 | 6.91 | 0.31 |

As is apparent from Table 1, a polymer compound according to the present invention has quite high transparency to $F_2$ excimer laser light of 157 nanometer wavelength, although a conventional polymer compound hardly has transparency. Therefore, it is found that the polymer compound is suitably used as a polymer constructing the base polymer and the dissolution suppressing agent of a resin composition of the next generation.

Example 2

Evaluation of Resolution of Positive Resist Exposed to ArF Laser

Resin 3 containing 3-hydroxy-1-perfluoroadamantyl acrylate as a monomeric unit was used as a base polymer, and triphenylsulfonium perfluorobutanesulfonate (TPS-PFBS) as an acid generating agent, and triethanolamine as a quencher, were added in propylene glycol monomethyl ether acetate (PGMEA) used as a solvent, as shown below, to prepare a positive resist composition.

| | |
|---|---|
| Resin 3 | 100 parts by weight |
| Acid generating agent: TPS-PFBS | 2.5 parts by weight |
| Quencher: triethanolamine | 0.2 parts by weight |
| Solvent: PGMEA | 900 parts by weight |

A positive resist film was formed of the positive resist composition and evaluated for resolution when ArF excimer laser light was applied. The measured resolution power and light exposure amount are shown in Table 2 below.

Example 3

Evaluation of Resolution of Negative Resist Exposed to ArF Laser

Resin 4 containing 3-hydroxy-1-perfluoroadamantyl acrylate as a monomeric unit was used as a base polymer and triphenylsulfonium perfluoromethanesulfonate (TPS-PFMS) and triphenylsulfonium perfluorobutanesulfonate (TPS-PFBS) as acid generating agents, and 4-phenylpyridine as a quencher, were added to propylene glycol monomethyl ether (PGME) and pure water as a solvent as shown below, to prepare a negative resist composition.

| | |
|---|---|
| Resin 4 | 100 parts by weight |
| Acid generating agent: TPS-PFMS | 1.0 part by weight |
| Acid generating agent: TPS-PFBS | 0.68 parts by weight |
| Quencher: 4-phenylpyridine | 0.2 parts by weight |
| Solvent: PGME | 1,000 parts by weight |
| Pure water | 80 parts by weigh |

A negative resist film formed of the negative resist composition was evaluated for resolution when ArF excimer laser light was applied. The measured resolution power and light exposure amount are shown in Table 2 below. In Table 2, PB stands for a preparatory heating process (Pre Bake) performed before light exposure and PEB stands for a heating process (Post Exposure Bake) performed after light exposure.

TABLE 2

| | Resist film thickness (nm) | PB/PEB Temperature (° C.) | Resolution to ArF light (nm) | Sensitivity to ArF light (mJ/cm$^2$) |
|---|---|---|---|---|
| Example 2 | 300 | 130/130 | 160 | 18 |
| Example 3 | 250 | 100/120 | 160 | 17 |

As shown in Table 2, the resist compositions according to the present invention containing polymer compounds of the present invention have excellent resolution power and sensitivity to light. It is found that the excellent transparency of the polymer compounds of the present invention used as a base polymer to ArF excimer laser light contributes to these characteristics. From this, it is obvious that the same effects can be obtained when $F_2$ excimer is laser is used.

In the previous example, a polymer compound according to the present invention is used as the base polymer of the resist composition. However, it is also obvious that a polymer compound may be designed so as to have a small weight-average molecular weight and used as a dissolution inhibitor agent optionally added to the resist composition.

INDUSTRIAL APPLICABILITY

As explained above, a polymer compound according to the present invention, a resist composition and a dissolution inhibitor agent containing the polymer compound are useful in a photoresist composition for the next-generation microfabrication, and particularly suitable as a material for forming a microfabrication pattern using $F_2$ excimer laser light of 157 nanometers in wavelength.

The invention claimed is:

1. A polymer compound comprising a monomeric unit derived from acrylic ester or methacrylic ester having a polycyclic group at a side chain, wherein all hydrogen atoms on the ring of the polycyclic group are fluorinated and the polycyclic group has a transparency to light of 157 nanometer wavelength, represented by an adsorption coefficient equal to or less than 3.0 μm$^{-1}$.

2. The polymer compound according to claim 1, wherein the polycyclic group is an adamantyl group.

3. The polymer compound according to claim 1, further comprising a second monomeric unit.

4. The polymer compound according to claim 3, wherein the second monomeric unit has an acid dissociable group.

5. The polymer compound according to claim 3, wherein the second monomeric group is a monomeric unit derived from acrylic ester or methacrylic ester.

6. A polymer compound comprising a monomeric unit having an alicyclic group at a side chain, wherein more than half the number of hydrogen atoms on the ring of the alicyclic group are substituted by fluorine atoms and has transparency to light of 157 nanometer wavelength, represented by an adsorption coefficient equal to or less than 3.0 μm$^{-1}$ and, wherein the alicyclic group has a hydrophilic group on a ring.

7. A polymer compound according to claim 6 wherein the alicyclic group is an adamantyl group.

8. A polymer compound according to claim 6 wherein the monomeric unit is derived from an acrylic ester or a methacrylic ester.

9. A polymer compound comprising a monomeric unit having an alicyclic group at a side chain, wherein more than half the number of hydrogen atoms on the ring of the alicyclic group are substituted by fluorine atoms and has transparency to light of 157 nanometer wavelength, represented by an adsorption coefficient equal to or less than 3.0 μm$^{-1}$ and wherein the monomeric unit is a unit derived from vinyl ether.

10. A polymer compound comprising a monomeric unit having an alicyclic group at a side chain, wherein more than half the number of hydrogen atoms on the ring of the alicyclic group are substituted by fluorine atoms and has transparency to light of 157 nanometer wavelength, represented by an adsorption coefficient equal to or less than 3.0 μm$^{-1}$ and wherein the alicyclic group has a hydrophilic group on a ring and said polymer further comprising a second monomeric unit, wherein the second monomeric unit has an acid insoluble group.

11. A polymer compound comprising a monomeric unit having an alicyclic group at a side chain, wherein more than half the number of hydrogen atoms on the ring of the alicyclic group are substituted by fluorine atoms and has transparency to light of 157 nanometer wavelength, represented by an adsorption coefficient equal to or less than 3.0 μm$^{-1}$, wherein the monomeric unit is a unit derived from vinyl ether and said polymer further comprising a second monomeric unit, wherein the second monomeric unit has an acid insoluble group.

12. A polymer compound comprising a monomeric unit having an alicyclic group at a side chain, wherein more than half the number of hydrogen atoms on the ring of the alicyclic group are substituted by fluorine atoms and has transparency to light of 157 nanometer wavelength, represented by an adsorption coefficient equal to or less than 3.0 μm$^{-1}$ wherein the alicyclic group has a hydrophilic group on a ring and said polymer further comprising a second monomeric unit wherein the second monomeric unit is a monomeric unit derived from a vinylic double bond.

13. A polymer compound comprising a monomeric unit having an alicyclic group at a side chain, wherein more than half the number of hydrogen atoms on the ring of the alicyclic group are substituted by fluorine atoms and has transparency to light of 157 nanometer wavelength, represented by an adsorption coefficient equal to or less than 3.0 μm$^{-1}$, wherein the monomeric unit is a unit derived from vinyl ether and said polymer further comprising a second monomeric unit wherein the second monomeric unit is a monomeric unit derived from a vinylic double bond.

14. A polymer compound having a monomeric unit represented by general formula (1)

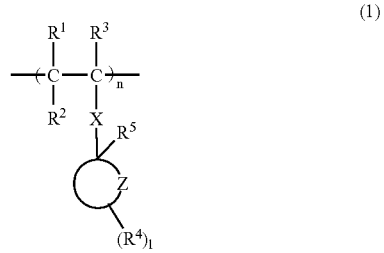

where n is an integer; X is an ester group of carboxylic acid,

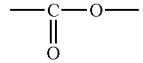

ether group (—O—), —CH$_2$—O—, or an alkylidene group,

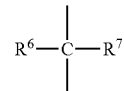

Z enclosed by a circle is an adamantyl group wherein more than half the number of hydrogen atoms on the adamantyl group are substituted by fluorine atoms; R$^1$, R$^2$, R$^3$, R$^5$, R$^6$ and R$^7$ are independently one selected from the group consisting of a hydrogen atom, lower alkyl group, fluorine atom, and fluorinated lower alkyl group; l is an integer of 0 to 3; and R$^4$ is a hydroxyl group, and having transparency to light of 157 nanometer wavelength represented by an adsorption coefficient equal to or less than 3.0 μm$^{-1}$.

15. The polymer compound according to claim 14, wherein the adamantyl group is a perfluoroadamantyl group.

16. A resist composition comprising a polymer compound having a monomeric unit derived from acrylic ester or methacrylic ester having a polycyclic group at a side chain, wherein all hydrogen atoms on the ring of the polycyclic group are fluorinated and said polymer compound has a transparency to light of 157 nanometer wavelength, represented by an adsorption coefficient equal to or less than 3.0 μm$^{-1}$.

17. The resist composition according to claim 16, comprising the polymer compound as a base polymer.

18. The resist composition according to claim 16, comprising the polymer compound as a dissolution inhibitor agent.

19. A resist composition comprising a polymer compound having a monomeric unit represented by general formula (1)

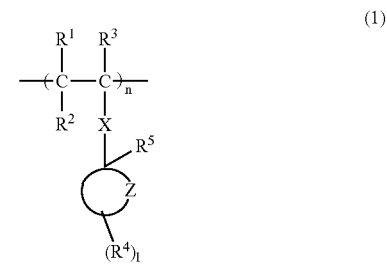

where n is an integer; X is an ester group of carboxylic acid,

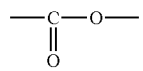

ether group (—O—), —CH$_2$—O—, or an alkylidene group,

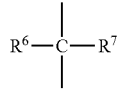

Z enclosed by a circle is an adamantyl group wherein more than half the number of hydrogen atoms on the adamantyl group are substituted by fluorine atoms; R$^1$, R$^2$, R$^3$, R$^5$, R$^6$ and R$^7$ are independently one selected from the group consisting of a hydrogen atom, lower alkyl group, fluorine atom, and fluorinated lower alkyl group; l is an integer of 0 to 3; and R$^4$ is a hydroxyl group;

and having a transparency to light of 157 nanometer wavelength represented by an adsorption coefficient equal to or less than 3.0 μm$^{-1}$.

20. The resist composition according to claim 19, comprising the polymer compound as a base polymer.

21. The resist composition according to claim 19, comprising the polymer compound as a dissolution inhibitor agent.

22. A resist dissolution inhibitor agent comprising a polymer compound having a monomeric unit derived from acrylic ester or methacrylic ester having a polycyclic group at a side chain, wherein all hydrogen atoms on the ring of the polycyclic group are fluorinated and said polymer compound has transparency to light of 157 nanometer wavelength, represented by an adsorption coefficient equal to or less than 3.0 μm$^{-1}$.

23. A resist dissolution inhibitor agent comprising a polymer compound having a monomeric unit represented by general formula (1)

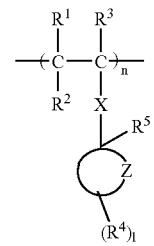

(1)

where n is an integer; X is an ester group of carboxylic acid,

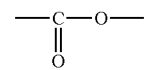

ether group (—O—), —CH$_2$—O—, or an alkylidene group,

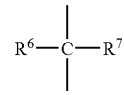

Z enclosed by a circle is an adamantyl group wherein more than half the number of hydrogen atoms on the adamantyl group are substituted by fluorine atoms; R$^1$, R$^2$, R$^3$, R$^5$, R$^6$ and R$^7$ are independently one selected from the group consisting of a hydrogen atom, lower alkyl group, fluorine atom, and fluorinated lower alkyl group; l is an integer of 0 to 3; and R$^4$ is a hydroxyl group, and having a transparency to light of 157 nanometer wavelength represented by an adsorption coefficient equal to or less than 3.0 μm$^{-1}$.

* * * * *